United States Patent
Merchant et al.

(10) Patent No.: US 7,736,961 B2
(45) Date of Patent: Jun. 15, 2010

(54) HIGH VOLTAGE DEPLETION FET EMPLOYING A CHANNEL STOPPING IMPLANT

(75) Inventors: Steven L. Merchant, Bedford, NH (US); Philip L. Hower, Concord, MA (US); Scott Paiva, Nashua, NH (US)

(73) Assignee: Texas Instruments Incorporated, Dallas, TX (US)

( * ) Notice: Subject to any disclaimer, the term of this patent is extended or adjusted under 35 U.S.C. 154(b) by 801 days.

(21) Appl. No.: 11/168,047

(22) Filed: Jun. 28, 2005

(65) Prior Publication Data
US 2006/0292771 A1 Dec. 28, 2006

(51) Int. Cl.
*H01L 21/337* (2006.01)

(52) U.S. Cl. .............. 438/186; 257/E27.148; 257/E29.265; 257/E21.403; 257/E21.421

(58) Field of Classification Search ........... 257/260, 257/402, 403, E27.148, E29.265, E21.403, 257/E21.421; 438/186, 194
See application file for complete search history.

(56) References Cited

U.S. PATENT DOCUMENTS

| | | | | |
|---|---|---|---|---|
| 5,171,699 | A * | 12/1992 | Hutter et al. | 438/206 |
| 5,302,543 | A * | 4/1994 | Sakakibara | 438/146 |
| 5,710,443 | A | 1/1998 | Blanchard | |
| 5,981,318 | A | 11/1999 | Blanchard | |
| 6,815,759 | B2 | 11/2004 | Horiguchi et al. | |
| 6,873,018 | B2 | 3/2005 | Bhattacharyya | |
| 2003/0052347 | A1 | 3/2003 | Fung | |
| 2003/0109112 | A1 * | 6/2003 | Wu | 438/400 |
| 2004/0140517 | A1 * | 7/2004 | Tsuchiko | 257/493 |
| 2006/0170055 | A1 * | 8/2006 | Mitros et al. | 257/360 |

* cited by examiner

*Primary Examiner*—Davienne Monbleau
*Assistant Examiner*—Matthew Reames
(74) *Attorney, Agent, or Firm*—Warren L. Franz; Wade J. Brady, III; Frederick J. Telecky, Jr.

(57) ABSTRACT

A high voltage field effect transistor device is fabricated. A substrate is provided. Isolation structures and well regions are formed therein. Drain well regions are formed within the well regions. An n-type channel stop resist mask is formed. N-type channel stop regions and n-type surface channel regions are formed. A p-type channel stop resist mask is formed. P-type channel stop regions and p-type surface channel regions are then formed. A dielectric layer is formed over the surface channel regions. Source regions are formed within the well regions. Drain regions are formed within the drain well regions. Back gate regions are formed within the well regions. Top gates are formed on the dielectric layer overlying the surface channel regions.

20 Claims, 5 Drawing Sheets

HIGH VOLTAGE DEPLETION FET EMPLOYING A CHANNEL STOPPING IMPLANT

FIELD OF INVENTION

The present invention relates generally to semiconductor devices and more particularly to high voltage field effect transistor devices and methods for fabricating high voltage field effect transistor devices.

BACKGROUND OF THE INVENTION

Transistors are the basic building blocks of conventional semiconductor devices, such as memory devices, central processing units (CPU), logic chips, and the like. A number of transistor types are employed in semiconductor devices including bipolar transistors and field effect transistors (FET). The bipolar transistors comprise an emitter, base, and collector and flow current from the emitter to the collector according to current supplied to the base. The field effect transistors comprise a source, drain, and gate and conduct current from the drain to the source according to a voltage supplied to the gate.

A common field effect transistor employed in semiconductor devices is a metal-oxide-semiconductor field effect transistor (MOSFET). Current is conducted from a source to a drain when a sufficient voltage is applied to a gate, otherwise conduction does not occur. The sufficient voltage is referred to as a threshold voltage.

Another common field effect transistor employed in semiconductor devices is a depletion field effect transistor, such as a JFET. The JFET operates similarly to the MOSFET, but instead turns off conduction of current from a source to a drain when a sufficient voltage, also referred to as a threshold voltage, is applied to a gate. Thus, when less than the threshold voltage is applied to the gate, current is conducted from the source to the drain. As a result, depletion field effect transistors have the ability to conduct current from source to drain without requiring power or a voltage applied to its gate.

The amount of current that can flow from the source to the drain of a given JFET is dependent upon the size of the channel region, which for JFET devices is from the source to the drain and underneath the gate. The size of the channel region includes a length or path length between the source and the drain and a depth of the channel region. Variations in the length and/or depth of the channel result in variations in conduction properties, which is typically undesirable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by employing surface channel regions for depletion field effect transistor devices. The surface channel region avoids undesirable variations in channel properties encountered in conventional devices that depend upon variations or tolerances in silicon on insulator (SOI) thickness or body thickness for variations or tolerances in channel properties. The channel properties of devices fabricated in accordance with the present invention rely substantially on the surface channel region, which can be fabricated uniformly regardless of SOI thickness variations.

Additionally, the present invention increases saturation current substantially. As a result, smaller devices can be fabricated that yield similar saturation current as much larger convention field effect transistor devices.

A method is disclosed for fabricating a high voltage field effect transistor device in accordance with an aspect of the invention. A substrate is provided. Isolation structures and well regions are formed therein. Drain well regions are formed within the well regions. An n-type channel stop resist mask is formed. N-type channel stop regions and n-type surface channel regions are formed. A p-type channel stop resist mask is formed. P-type channel stop regions and p-type surface channel regions are then formed. A dielectric layer is formed over the surface channel regions. Source regions are formed within the well regions. Drain regions are formed within the drain well regions. Back gate regions are formed within the well regions. Top gates are formed on the dielectric layer overlying the surface channel regions. Other methods and devices in accordance with aspects of the invention are also disclosed.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

As semiconductor devices continue to decrease in size, limitations of silicon as a substrate material are approaching. One mechanism employed to overcome the limitations of silicon is to employ silicon-on-insulator (SOI) as a substrate/wafer for device formation. As a result, employing SOI for wafers or substrates permits further scaling of semiconductor devices.

SOI wafers generally comprise a semiconductor material, such as silicon, and a buried oxide layer. SOI wafers offer a number of benefits over conventional silicon only wafers. For example, SOI wafers have improved radiation resistance and tolerate higher temperatures better than conventional silicon wafers. Additionally, SOI wafers have shown reductions in source/drain capacitance, reduced channel effects, latch-up immunity, speed improvement, reduce power consumption and the like.

The present invention facilitates semiconductor device fabrication by employing surface channel regions for depletion field effect transistor devices formed on SOI wafers or other semiconductor wafers. The surface channel region avoids undesirable variations in channel properties encountered in conventional devices that depend upon variations or tolerances in SOI thickness for variations or tolerances in channel properties. The channel properties of devices fabricated in accordance with the present invention rely substantially on the surface channel region, which can be fabricated uniformly regardless of SOI thickness variations. Additionally, the present invention increases saturation current substantially. As a result, smaller devices can be fabricated that yield similar saturation current as much larger convention field effect transistor devices.

Figure 1:
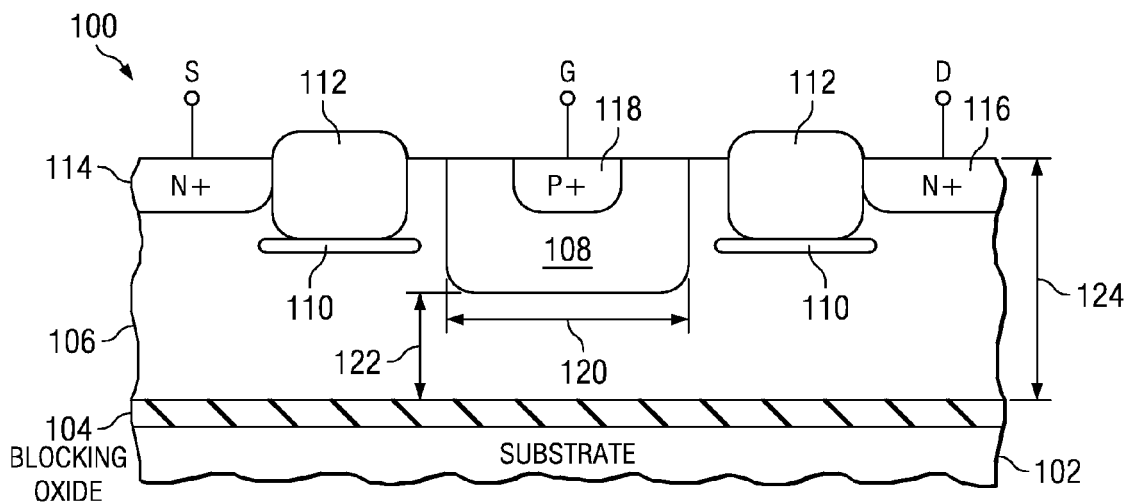
FIG. 1 is a cross sectional view of a conventional depleted field effect transistor device formed on a SOI body.

FIG. 1 is a cross sectional view of a conventional depleted field effect transistor device 100 formed on a SOI substrate or body. This view is provided to illustrate deficiencies with conventional FET transistors formed on SOI substrates as appreciated by the inventor of the present invention. The device 100 comprises a deep n-well channel and a shallow p-well gate.

The device 100 comprises a SOI semiconductor substrate 102 that comprises a blocking oxide layer 104 as an insulator. An n-well region 106 is formed on the blocking oxide layer 104 by implanting n-type dopant(s) into the semiconductor substrate 102 above the blocking oxide layer 104. An spwell region 108 is formed within the n-well region 106 by selectively implanting p-type dopant(s) at a target gate region.

Channel stop regions 110 are formed by an n-type channel stop implant. The implant causes the dopant concentration at the surface of the regions 110 to be higher than the n-well region 106 below in order to mitigate inversion and formation of parasitic MOS transistors. Field oxide layers 112 are formed on the channel stop regions 110.

A source region 114 and a drain region 116 are formed at target source/drain regions by selectively implanting n-type dopant(s). A gate region 118 is formed by selectively implanting p-type dopant(s) within the spwell 108.

Performance of the device 100, including current conduction, is substantially affected by an n-well channel length 120 and channel thickness 122. The n-well channel length 120 is a portion of the channel that forms between the source region 114 and the drain region 116 during conduction. The channel thickness 122 is from the top of the blocking oxide layer 104 to the bottom of the spwell 108. A pinch-off voltage (turn off voltage) is substantially affected by the channel thickness 122.

Typical starting materials for the SOI substrate 102 tend to have a SOI thickness specification 124 that varies by a substantial amount. For example, a typical SOI wafer/substrate has a thickness of 6 micro-meters and a variation of about +1/−1 micro-meters. The depth of the spwell 108 is relatively constant, thus the variation in the thickness specification 124 results in substantial variations in the channel thickness. Continuing the above example, a typical channel thickness is 3 micro-meters. Therefore, a variation of +1/−1 micro-meters in thickness for a 6 micro-meter substrate results in a +1/−1 micro-meter variation in channel thickness, which represents about a 30% variation.

Such variations in channel thickness result in undesirable variations in operational properties of transistor devices, including undesirable variations in conduction characteristics (saturation current) and pinch-off voltage.

As stated above, the device 100 is a SOI JFET with a deep n-well channel and a shallow p-well gate. The identified problems of variation in channel thickness and conduction properties extend to other types of FET devices and depletion FET devices.

Figure 2:
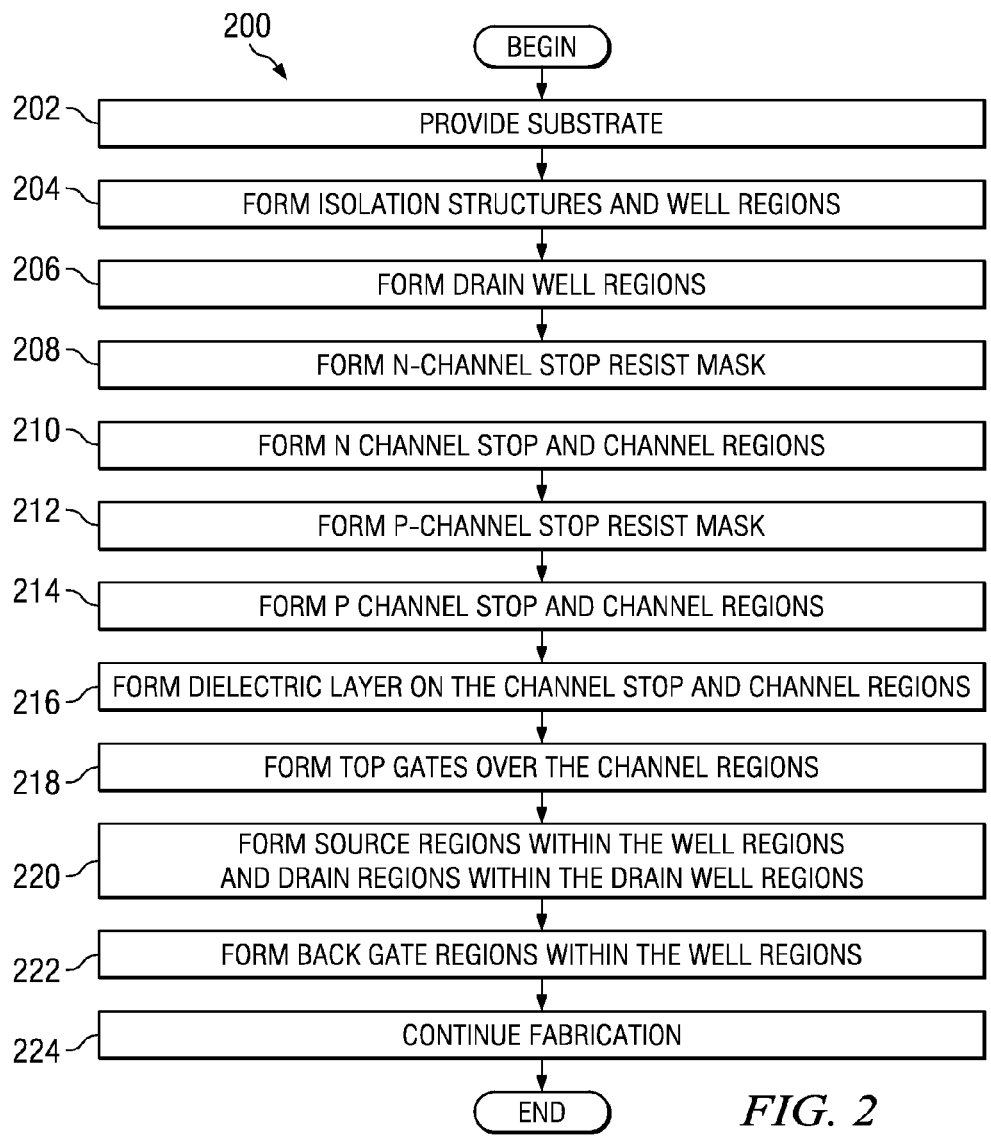
FIG. 2 is a flow diagram illustrating a method of fabricating a depletion field effect transistor device in accordance with an aspect of the present invention.

FIG. 2 is a flow diagram illustrating a method 200 of fabricating a depletion field effect transistor device in accordance with an aspect of the present invention. The method 200 fabricates the device with uniform channel characteristics that are relatively independent of wafer thickness.

The method begins at block 202, wherein a semiconductor substrate or body is provided. The substrate is comprised of a semiconductor material, such as silicon. The substrate may comprise an insulating or blocking layer such as silicon on insulator (SOI) and/or germanium on insulator (GOI) type wafers.

Well regions and isolation regions are formed within the semiconductor substrate at block 204. P-well regions are formed within the semiconductor substrate within an n-type region by implanting p-type dopant(s), such as boron, within an n-type region. N-well regions are also formed within the semiconductor substrate within a p-type region by implanting n-type dopant(s). In alternate aspects of the invention, a p-type semiconductor substrate can be employed, and implanting the p-type dopant(s), such as boron, within the n-type region can be omitted. The isolation regions isolate the n-type and p-type regions and also electrically isolate individual transistor devices.

Drain well regions are formed at block 206 by selectively implanting dopant(s). The drain well regions serve to define drain-source voltages for the devices and also define the size/width of p-well and n-well regions, which also defines channel length. N-type drain well regions are formed within the n-type region by selectively implanting n-type dopant(s), such as phosphorous, and p-type drain well regions are formed within the p-type region by selectively implanting p-type dopant(s), such as boron.

A channel stop resist layer/mask is formed at block 208 that selectively exposes channel stop regions and channel regions within the n-type region. The resist layer is comprised of a suitable photoresist material. In conventional devices, a similar resist mask is employed, but it only exposes the channel stop regions and not the channel regions. Subsequently, an n-type shallow implant is performed that forms n-type surface channel regions and n-type channel stop regions within the n-type region at block 210. The implant is performed with a specific dose and energy to obtain a desired profile and concentration for the channel stop and channel regions within the n-type region. It is noted that the n-type channel regions are formed without requiring an additional resist mask or processing step. It is also noted that the depth of the channel region can formed substantially uniformly. As an example, a suitable implant process can be employed that forms channel regions with a depth that varies by less than about 5 percent, from process to process. Subsequently, the channel stop resist layer is removed. An exemplary implant is performed with a dose of $1E12/cm^2$ and at an energy of 150 keV.

A p-type channel stop resist layer/mask is formed at block 212 that selectively exposes channel stop regions and channel regions within the p-type region. The p-type channel stop resist layer is also comprised of a suitable photoresist material. In conventional devices, a similar resist mask is employed, but it only exposes the channel stop regions and not the channel regions. Thereafter, a p-type shallow implant is performed that forms p-type surface channel regions and p-type channel stop regions within the p-type region at block 214. Again, the implant is performed with a specific dose and energy to obtain a desired profile and concentration for the channel stop and channel regions within the p-type region. The p-type channel stop resist layer is then removed after forming the channel stop and channel regions.

The dopant concentration of the formed surface channel regions impacts pinch off voltages for the formed devices. Generally, a higher concentration yields a higher (in magnitude) pinch off voltage and a lower concentration yields a lower (in magnitude) pinch off voltage.

It is noted that the method 200 forms the surface channel regions with similar dopant type and concentration profile as the channel stop regions in order to avoid one or more additional masking operations. However, it is appreciated that the present invention can employ variations of the method 200, such as including additional masking operations and implants, wherein the channel regions are formed with dopant profiles varied from that of the channel stop regions.

Dielectric layers/regions are formed over the channel stop regions and channel regions at block 216. The dielectric layers are formed over the n-type channel stop and channel regions within the n-type region and over the p-type channel stop and channel regions within the p-type regions. The dielectric layers also define active regions of the device.

An example of a suitable dielectric layer that can be employed is a field oxide region comprised of silicon dioxide and grown via a thermal process. A separate mask can be employed that exposes the channel stop and channel regions or, alternatively, the dielectric layers can be formed separately in the n-type and p-type regions prior to removing the channel stop resist layers from above.

Top gates are formed over the channel regions at block 218. The top gates are comprised of a suitable electrode material, such as polysilicon, and are formed on a portion of the dielectric layer that overlies the channel regions. The top gates are formed in both the n-type and p-type regions and are formed by depositing the suitable electrode material, such as polysilicon or metal, and then patterning the deposited material to form the top gates.

Source regions are formed within the well regions and drain regions are formed within drain well regions at block 220. N-type source regions are formed within the p-well regions and n-type drain regions are formed within the n-type drain well regions for the n-type region. The n-type source and drain regions can be formed by employing a separate resist mask that exposes target drain and source regions followed by an n-type dopant.

P-type source regions are formed within the n-well regions and p-type drain regions are formed within the p-type drain well regions for the p-type region. The p-type source and drain regions can be formed by employing a separate resist mask that exposes target drain and source regions followed by an p-type dopant.

Back gate regions are formed within the well regions at block 222. The back gate regions within the n-type region are formed by implanting p-type dopant(s) within the p-well regions and back gate regions within the p-type region are formed by implanting n-type dopant(s) within the n-well regions.

Other layers and/or structures are subsequently formed at block 224. For example, sidewall spacers can be formed on lateral edges of the top gate, pre-metal dielectric layers can be formed, contacts can be formed within the pre-metal dielectric layers to the back gates, top gates, source regions, and drain regions, and the like.

In operation, the back gates and top gates are typically connected together so that the same pinch off voltage is applied to the top and back gates. The back gates are arranged to pinch off the channel regions from below whereas the top gates pinch off the channel regions from above. Employing both the back and top gates permits more charge to be present in the channel regions thereby obtaining higher saturation currents. Furthermore, employing both the back and top gates along with the formed channel regions yields saturation current greater than conventional devices, about 100 times greater in one example. As a result, smaller devices can be employed to obtain a desired saturation current, such as $\frac{1}{100}$ the size in the one example by employing the method 200.

In an alternate aspect of the method 200, the device can be fabricated without forming the top gates. For such a variation, the back gates exclusively pinch off the channel region, but would require a higher pinch off voltage. In one example, a formed device using only a back gate requires double the pinch off voltage of a device employing both back and top gates.

FIGS. 3A to 3K depict stages of fabrication for an exemplary transistor device 300 fabricated according to the method 200 of FIG. 2. The transistor device 300 is an n-type depletion transistor that employs a back gate and a top gate for pinch off operation. Additionally, the transistor device 300 includes a surface channel region that permits uniform current transfer characteristics. As a result of this surface channel region, performance characteristics of the device 300 are relatively independent of SOI layer thickness or body thickness.

The device 300 is exemplary in nature and is provided to more fully illustrate the present invention. It is appreciated that other depletion field effect transistors can be fabricated in accordance with the present invention and include variations in layers and structures from those depicted with respect to the device 300.

Figure 3A:
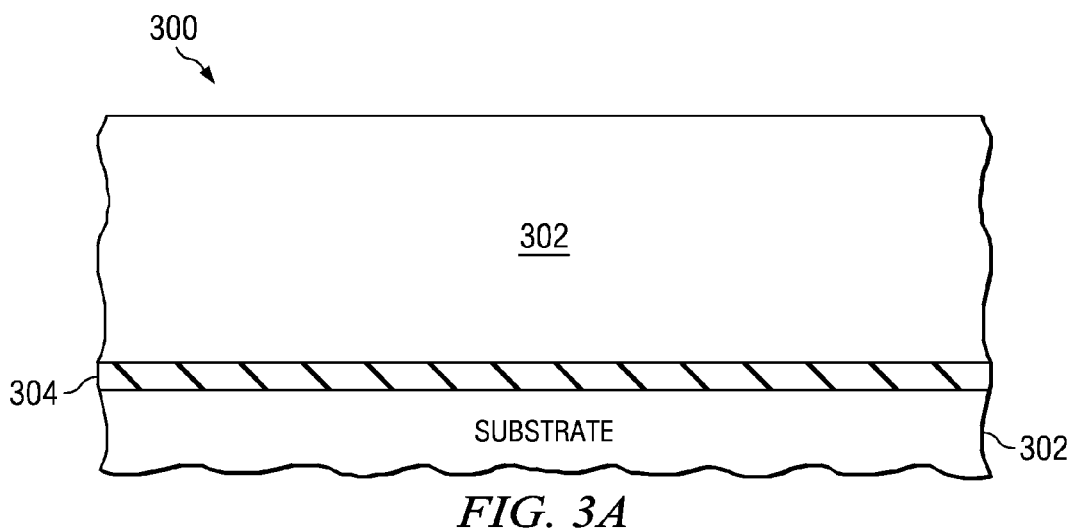
FIG. 3A is a cross sectional view of a depletion field effect transistor device at a stage of fabrication in accordance with an aspect of the present invention.

FIG. 3A is a cross sectional view of the depletion field effect transistor device 300 at a stage of fabrication in accordance with an aspect of the present invention. A substrate 302 is a silicon on insulator (SOI) type substrate and includes a buried oxide layer 304. The substrate 302, in this example, is comprised of silicon. It is appreciated that other transistor devices in accordance with the present invention can comprise other substrate materials and/or compositions, such as only silicon, germanium, and germanium on insulator (GOI) type substrates.

Figure 3B:
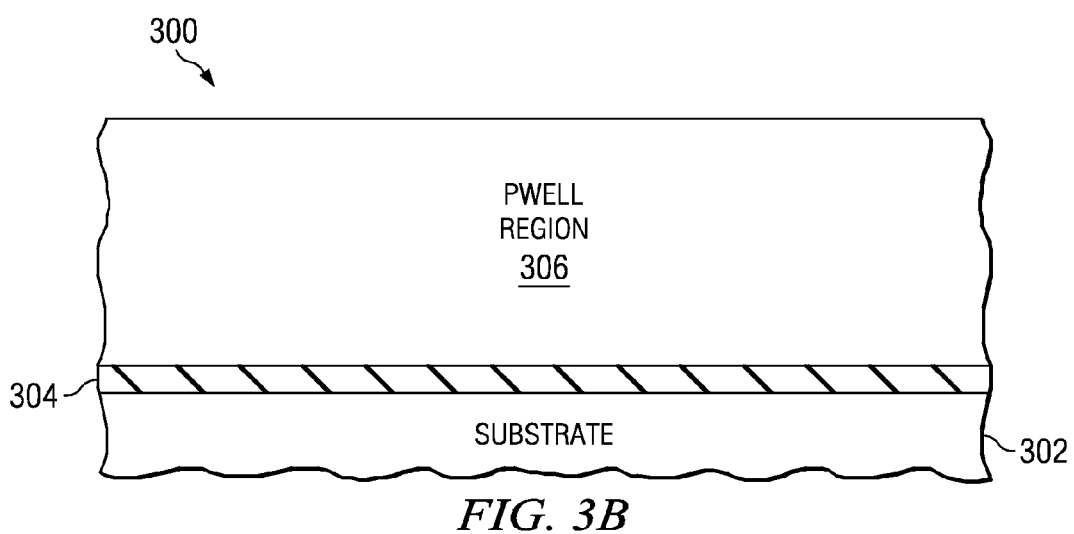
FIG. 3B is another cross sectional view of the depletion field effect transistor device at a stage of fabrication in accordance with an aspect of the present invention.

FIG. 3B is another cross sectional view of the depletion field effect transistor device 300 at a stage of fabrication in accordance with an aspect of the present invention. A p-type well region 306 is formed in the substrate 302 over the buried oxide layer 304. The well region 306 is formed by implanting p-type dopant(s), such as boron. In alternate aspects of the invention, the substrate 302 is sufficiently doped with a p-type dopant prior to fabrication.

Figure 3C:
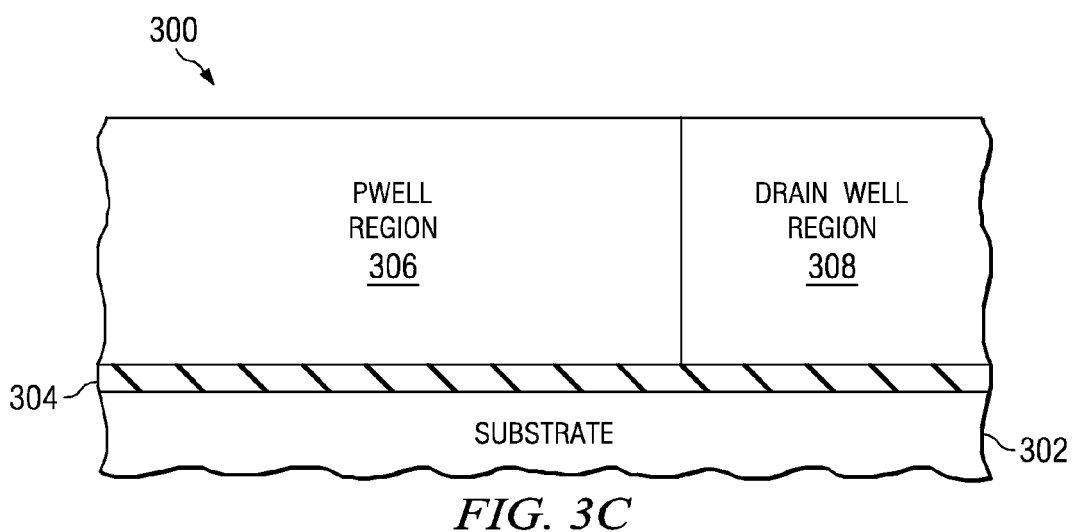
FIG. 3C is yet another cross sectional view of the depletion field effect transistor device at a stage of fabrication in accordance with an aspect of the present invention.

FIG. 3C is yet another cross sectional view of the depletion field effect transistor device 300 at a stage of fabrication in accordance with an aspect of the present invention. A drain well region 308 is formed within the p-type well region 306 by selectively implanting n-type dopant(s), such as phosphorous. The drain well region 308 at least partially defines drain-source voltages for the device and also defines the size/width of p-well and n-well regions, which also defines channel length.

Figure 3D:
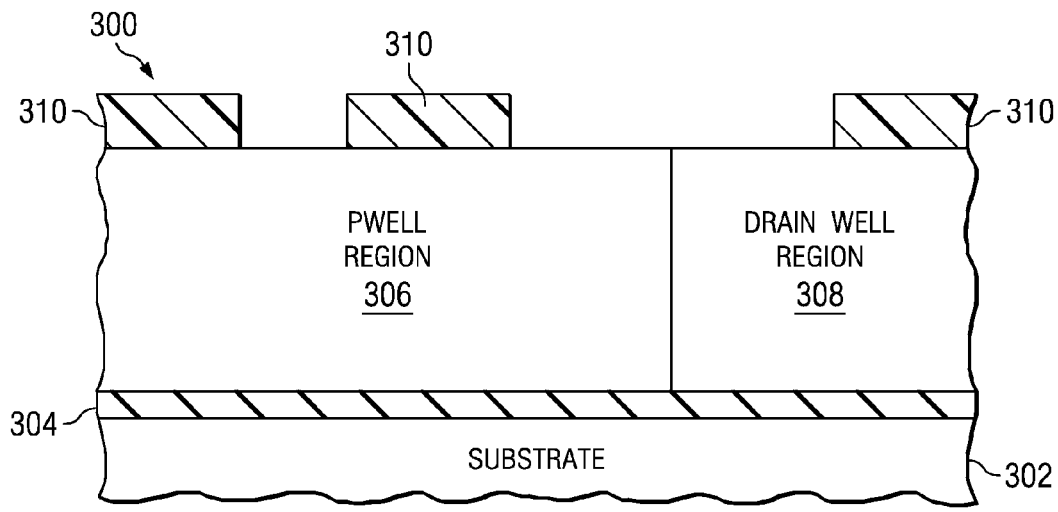
FIG. 3D is another cross sectional view of the depletion field effect transistor device at a stage of fabrication in accordance with an aspect of the present invention.

FIG. 3D is another cross sectional view of the depletion field effect transistor device 300 at a stage of fabrication in accordance with an aspect of the present invention. A channel stop resist layer/mask 310 is formed over the device that selectively exposes channel stop regions and channel regions. The resist layer/mask 310 is comprised of a suitable masking material, such as photoresist. It is noted that the resist layer/mask 310 facilitates formation of both channel stop regions and surface channel regions, unlike conventional fabrication processes that employ a resist mask only for formation of channel stop regions.

Figure 3E:
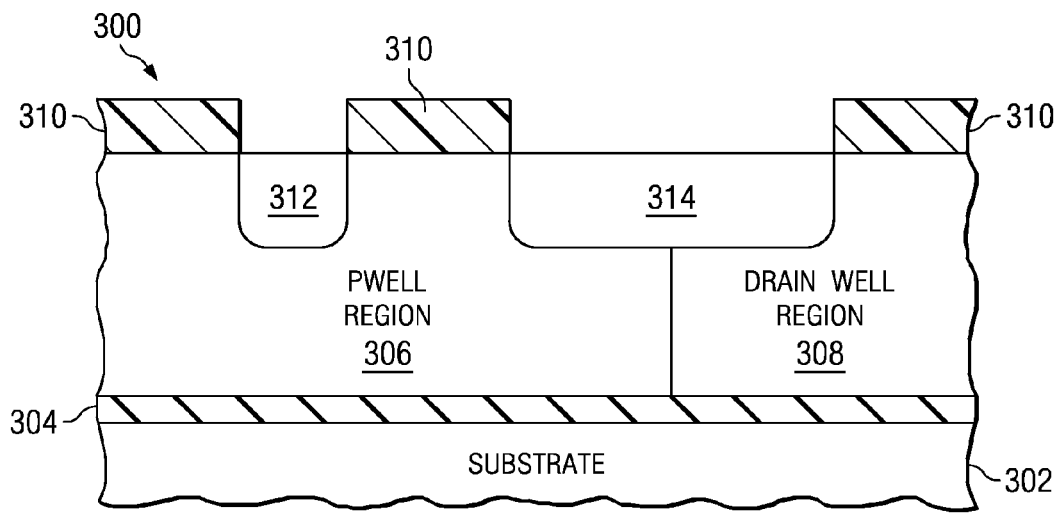
FIG. 3E is yet another cross sectional view of the depletion field effect transistor device at a stage of fabrication in accordance with an aspect of the present invention.

FIG. 3E is yet another cross sectional view of the depletion field effect transistor device 300 at a stage of fabrication in accordance with an aspect of the present invention. An n-type shallow implant is performed that forms an n-type surface channel region 314 and n-type channel stop regions 312. The implant is performed with a specific dose and energy to obtain a desired profile and concentration for the channel stop 312 and the surface channel 314 regions. It is noted that the surface channel region 314 is formed without requiring an additional resist mask or processing step. It is also noted that the depth of the surface channel region 314 can formed substantially uniformly. As an example, a suitable implant process can be employed that forms channel regions with a depth that varies by less than about 5 percent, from process to process. As a result, substantially uniform channel characteristics can be obtained that do not substantially vary with substrate 302 thickness, as with conventional devices.

The dopant concentration of the surface channel region 314 impacts a pinch off voltage for the device 300. Generally, a higher n-type concentration yields a higher (in magnitude) pinch off voltage and a lower concentration yields a lower (in magnitude) pinch off voltage. As a result, process parameters for the implant for forming the surface channel region 314 can be adjusted to obtain a desired pinch off voltage.

In this example, the surface channel region 314 and the channel stop regions 312 are formed via the same implantation process and have substantially similar dopant concentrations and depth. The implantation process employs the resist mask 310 for formation of both regions 312 and 314. However, other devices can be fabricated in accordance with the present invention that yield varied dopant concentrations and depths for the channel stop regions 312 and the surface channel region 314. Typically, an additional mask and/or implantation process is employed to obtain the varied dopant properties.

Figure 3F:
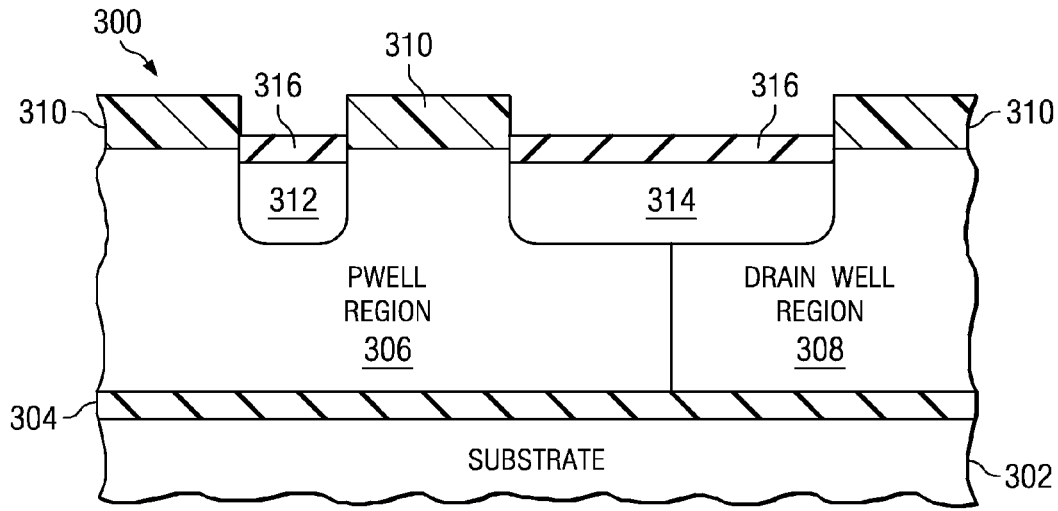
FIG. 3F is another cross sectional view of the depletion field effect transistor device at a stage of fabrication in accordance with an aspect of the present invention.

FIG. 3F is another cross sectional view of the depletion field effect transistor device 300 at a stage of fabrication in accordance with an aspect of the present invention. A field oxide layer 316 is relatively thin and is formed over the channel stop regions 312 and the surface channel region 314 by growing a layer of silicon dioxide via a thermal process. The field oxide layer 316 also defines active regions of the device 300. It is appreciated that other dielectric layers can be employed in place of the field oxide layer 316 and still be in accordance with the present invention.

Figure 3G:
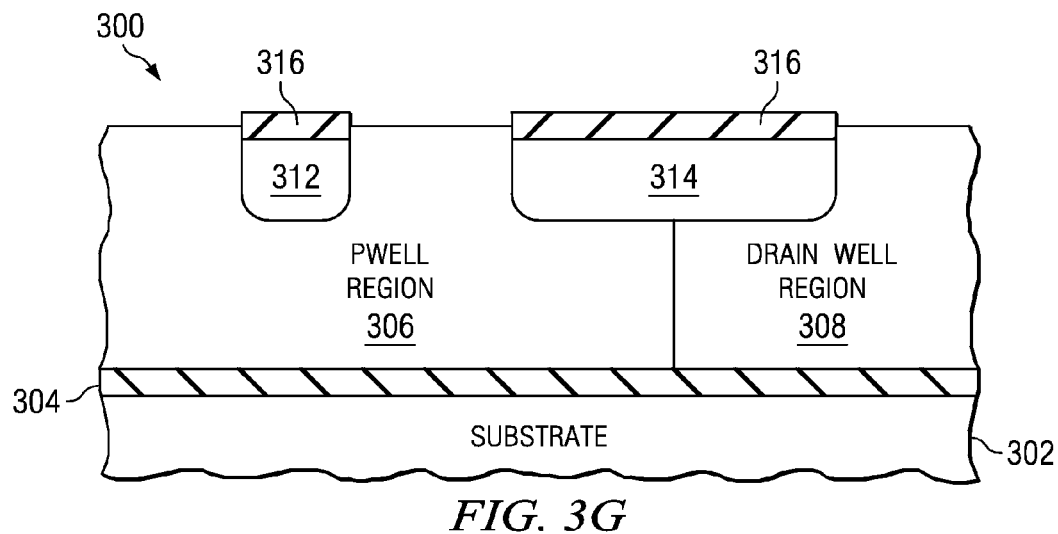
FIG. 3G is yet another cross sectional view of the depletion field effect transistor device at a stage of fabrication in accordance with an aspect of the present invention.

FIG. 3G is yet another cross sectional view of the depletion field effect transistor device 300 at a stage of fabrication in accordance with an aspect of the present invention. Here, the resist mask 310 is removed from the device 300. It is appreciated that the mask can be removed at an earlier stage or later stage and still be in accordance with the present invention.

Figure 3H:
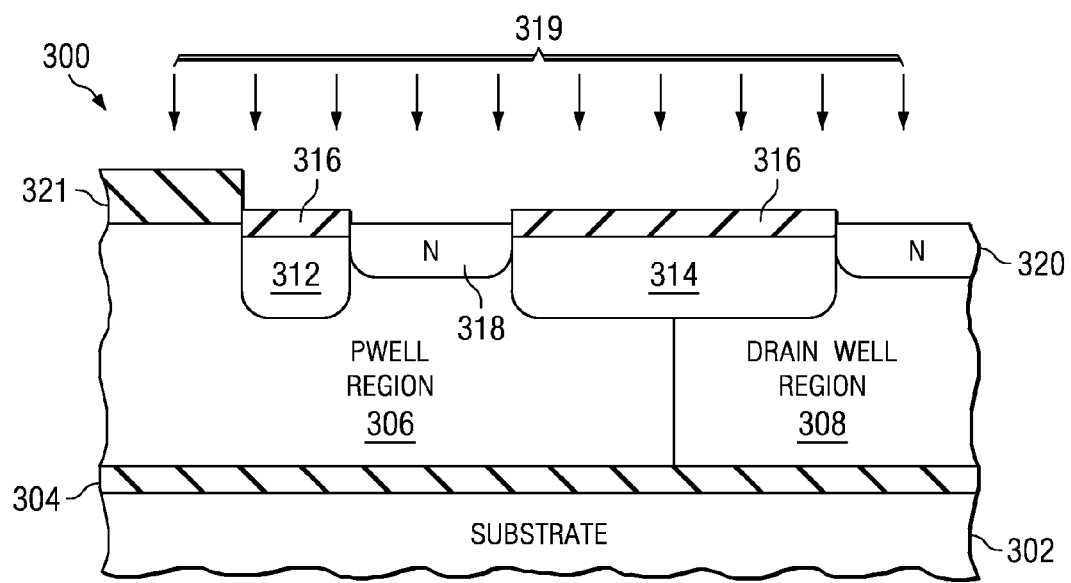
FIG. 3H is another cross sectional view of the depletion field effect transistor device at a stage of fabrication in accordance with an aspect of the present invention.

FIG. 3H is another cross sectional view of the depletion field effect transistor device 300 at a stage of fabrication in accordance with an aspect of the present invention. A source region 318 is formed within the p-type well region 306 and a drain region 320 is formed within the n-type drain well region 308 by a suitable implantation process 319. Typically, a source/drain mask 321 is employed to expose target source/drain regions and an implant with n-type dopant(s) is then performed.

Figure 3I:
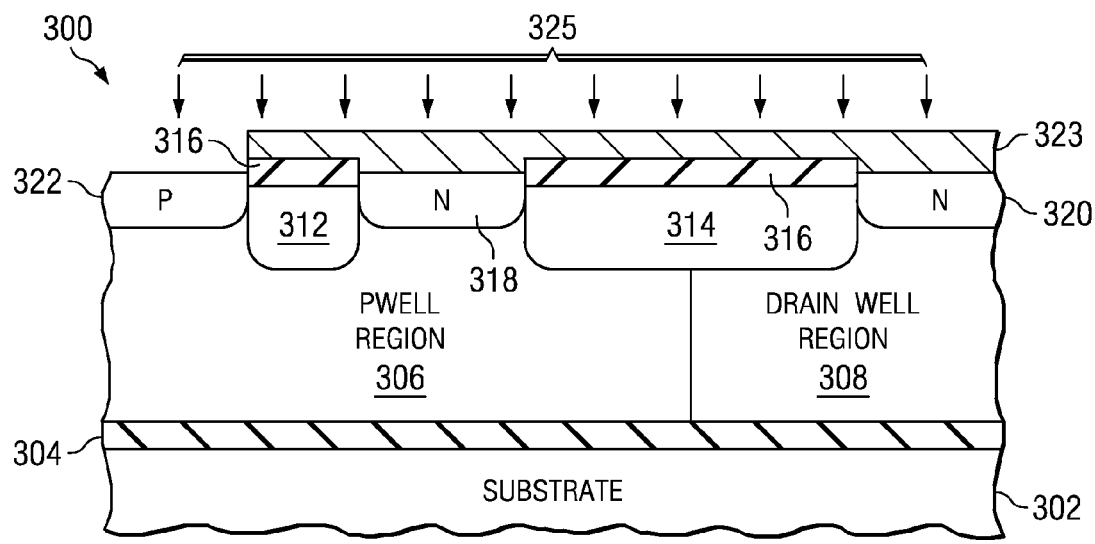
FIG. 3I is yet another cross sectional view of the depletion field effect transistor device at a stage of fabrication in accordance with an aspect of the present invention.

FIG. 3I is yet another cross sectional view of the depletion field effect transistor device 300 at a stage of fabrication in accordance with an aspect of the present invention. A back gate region 322 is formed within the p-type well region 306 by selectively implanting p-type dopant(s) 325 using a resist mask 323. The back gate region 322 has a dopant concentration higher than that of the p-type well region 306. The back gate region 322 pinches off the surface channel region 314 from the bottom when a sufficient voltage is applied during operation of the device 300.

Figure 3J:
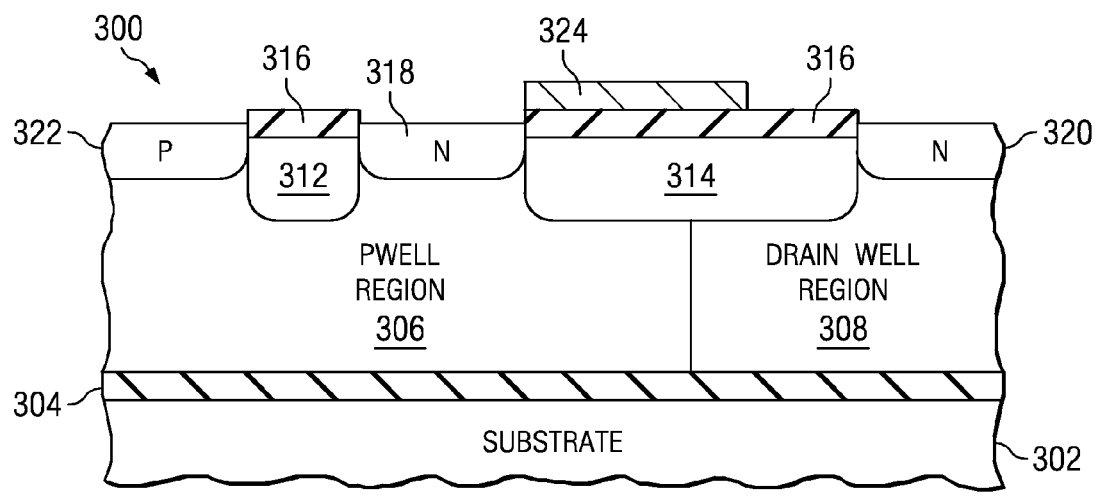
FIG. 3J is another cross sectional view of the depletion field effect transistor device at a stage of fabrication in accordance with an aspect of the present invention.

FIG. 3J is another cross sectional view of the depletion field effect transistor device 300 at a stage of fabrication in accordance with an aspect of the present invention. A top gate 324 is formed over the surface channel region 314 as shown in FIG. 3J. The top gate 324 is formed by depositing a conductive material, such as polysilicon, over the device 300 and patterning the deposited material to form the top gate 324 comprised of the deposited material. The top gate 324 pinches off the surface channel region 314 from the top when a sufficient voltage is applied during operation of the device 300.

For exemplary purposes and to facilitate a better understanding of the present invention, some examples of doses and energy values for forming the various regions are provided. It is appreciated that these values are only examples and that the present invention is not limited to only these values and can employ other energy and dose values. The examples are as follows: an N-type well implant employs P+31 with a dose of $9.E12/cm^2$ and an energy of 80 KeV, a p-type well implant employs B+11 with a dose of $7E12/cm^2$ and an energy of 40 KeV, a back gate implant (p-type) employs B+11 with a dose of $3E15/cm^2$ and an energy of 20 KeV, a source implant (n-type) employs P+31 with a dose of $4.7E14/cm^2$ and an energy of 100 KeV, and a drain implant employs As+75 with a dose of $3E15/cm^2$ and an energy of 135 KeV.

Figure 3K:
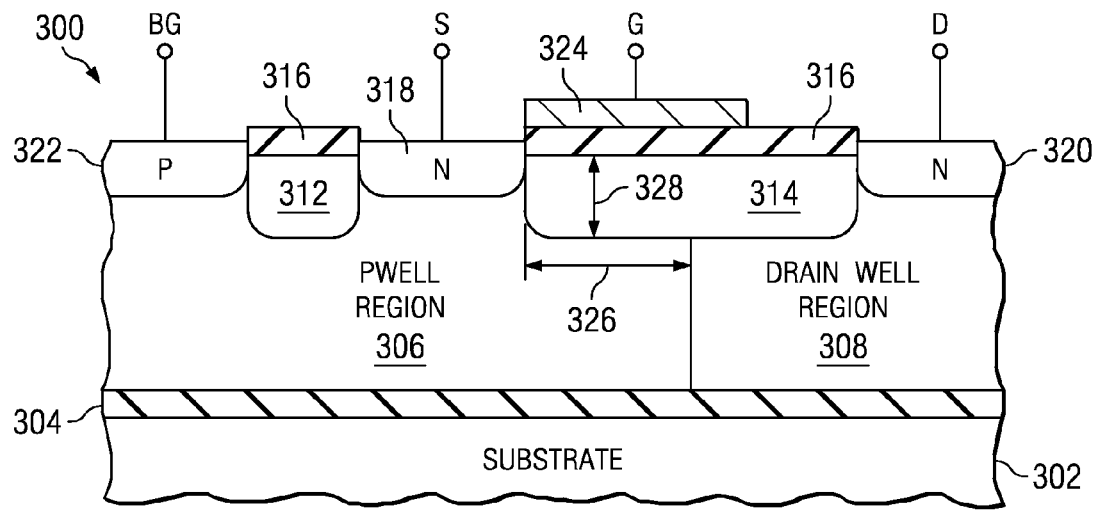
FIG. 3K is yet another cross sectional view of the depletion field effect transistor device after fabrication in accordance with an aspect of the present invention.

FIG. 3K is yet another cross sectional view of the depletion field effect transistor device 300 at a stage of fabrication in accordance with an aspect of the present invention. This view is provided to illustrate some characteristics of the device 300 and their impact upon device operation.

A channel length 326 is defined from a first edge of the surface channel region 314 to the drain well region 308, as shown in FIG. 3K. A channel depth 328 is dependent solely on a depth of the surface channel region 314.

Performance of the device 300, including current conduction, is substantially affected by the channel length 326 and channel thickness or depth 328. A pinch-off voltage (turn off voltage) is substantially affected by the channel thickness 328. Saturation current can be maintained uniformly across devices because the current is dependent on the channel length 326 and thickness 328, which can be controlled relatively uniformly. As a result, substantial variations are mitigated. For example, a 5 percent variation in channel length or channel thickness for the device 300 yields about a 5 percent variation in saturation current. In contrast, conventional wafers having a thickness of 6 micro-meters and a variation of 1 micro-meter can result in a 30 percent variation in channel thickness and, as a result, saturation current, as described with respect to FIG. 1

Other layers and/or structures can be subsequently formed on the device 300. For example, sidewall spacers can be formed on lateral edges of the top gate 324, pre-metal dielectric layers can be formed, contacts can be formed within the pre-metal dielectric layers to the back gates, top gates, source regions, and drain regions, and the like.

In operation, the back gate 322 and the top gate 324 are connected together so that the same pinch off voltage is applied to the top and back gates. As stated above, the back gate is arranged to pinch off the surface channel region 314 from below whereas the top gate 324 is arranged to pinch off the surface channel region 314 from above. Employing both the back 322 and top 324 gates permits more charge to be present in the surface channel region thereby obtaining higher saturation currents.

It is appreciated that transistor devices can be fabricated in accordance with the present invention that omits a top gate. For such a variation, the back gate exclusively pinches off the channel region, but would require a higher pinch off voltage. In one example, a formed device using only a back gate requires double the pinch off voltage of a device employing both back and top gates.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a depletion field effect transistor comprising:
   providing a semiconductor substrate;
   forming a first well region within the semiconductor substrate having a first conductivity type;
   forming a drain well region within the semiconductor substrate adjacent the first well region and having a second conductivity type;
   forming a channel stop resist mask over the semiconductor substrate that exposes a targeted channel stop region and a targeted surface channel region;
   implanting a dopant having the second conductivity type to form a surface channel region and a channel stop region, wherein the surface channel region is formed within a portion of the first well region and the drain well region;
   forming a source region of the second conductivity type within the first well region; and
   forming a drain region of the second conductivity type within the drain well region.

2. The method of claim 1, wherein the first conductivity type is n-type and the second conductivity type is p-type.

3. The method of claim 1, wherein the first conductivity type is p-type and the second conductivity type is n-type.

4. The method of claim 1, further comprising forming a back gate region having the first type conductivity within the first well region.

5. The method of claim 4, further comprising forming a dielectric layer on the channel stop regions and the surface channel region.

6. The method of claim 5, wherein forming the dielectric layer comprises growing a thin field oxide.

7. The method of claim 5, further comprising forming a top gate on a portion of the dielectric layer overlying the surface channel region.

8. The method of claim 7, wherein forming the top gate comprises depositing a layer of polysilicon and patterning the deposited layer of polysilicon.

9. The method of claim 1, wherein providing the semiconductor substrate comprises providing a silicon on insulator substrate comprising a buried oxide layer.

10. The method of claim 1, wherein forming the surface channel region comprises implanting the dopant with a dose and energy selected at least partially according to a desired saturation current.

11. The method of claim 1, wherein forming the drain well region comprises forming the drain well region with a width selected at least partially according to a desired saturation current.

12. A method of fabricating a plurality of transistors comprising:
   providing a semiconductor substrate;
   forming isolation structures;
   forming pwell regions within an n-type region;
   forming nwell regions within a p-type region;
   forming n-type drain well regions within the pwell regions;
   forming p-type drain well regions within the nwell regions;
   forming a first channel stop resist mask that exposes targeted channel stop regions and targeted surface channel regions within the n-type region;
   forming n-type channel stop regions and n-type surface channel regions via the first channel stop resist mask;
   forming a second channel stop resist mask that exposes targeted channel stop regions and targeted surface channel regions within the p-type region;
   forming p-type channel stop regions and p-type surface channel regions via the second channel stop resist mask; and
   forming n-type source/drain regions on opposing sides of the n-type surface channel regions, and p-type source/drain regions on opposing sides of the p-type surface channel regions, respectively.

13. The method of claim 12, further comprising forming p-type back gate regions within the pwell regions.

14. The method of claim 13, further comprising forming n-type back gate regions within the nwell regions.

15. The method of claim 14, further comprising forming a gate electrode layer on the n-type and p-type surface channel regions.

16. The method of claim 15, further comprising forming top gates comprised of a conductive material on the gate electrode layer.

17. The method of claim 12, further comprising removing the first channel stop resist mask.

18. A method of fabricating a field effect transistor comprising:

selecting a pinch off voltage and a saturation current;

providing a semiconductor substrate having a thickness specification;

forming a first well region having a first conductivity type;

forming a drain well region having a second conductivity type;

forming a channel stop resist mask that exposes targeted channel stop regions and a targeted surface channel region;

forming a surface channel region with a depth and dopant profile selected according to the selected pinch off voltage and the selected saturation current and independent of the thickness specification;

forming a source region of the second conductivity type within the first well region;

forming a drain region of the second conductivity type within the drain well region; and forming a back gate region within the first well region.

19. The method of claim 18, further comprising forming a dielectric layer over the surface channel region.

20. The method of claim 19, further comprising forming a top gate electrode on the dielectric layer.

* * * * *